(12) United States Patent
Mahon et al.

(10) Patent No.: US 9,614,563 B2
(45) Date of Patent: *Apr. 4, 2017

(54) DOUBLE DOWN-CONVERSION WITH MULTIPLE INDEPENDENT INTERMEDIATE FREQUENCIES FOR E-BAND APPLICATIONS

(71) Applicant: MACOM Technology Solutions Holdings, Inc., Lowell, MA (US)

(72) Inventors: Simon J. Mahon, Avalon (AU); James T. Harvey, Rushcutters Bay (AU); Emmanuelle R. O. Convert, Cammeray (AU)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/194,981

(22) Filed: Jun. 28, 2016

(65) Prior Publication Data
US 2016/0308565 A1 Oct. 20, 2016

Related U.S. Application Data

(63) Continuation of application No. 14/580,674, filed on Dec. 23, 2014, now Pat. No. 9,407,205.

(51) Int. Cl.
*H04B 1/26* (2006.01)
*H04B 1/06* (2006.01)
(Continued)

(52) U.S. Cl.
CPC ............ *H04B 1/126* (2013.01); *H03D 7/16* (2013.01); *H04B 1/06* (2013.01); *H04B 1/1036* (2013.01);
(Continued)

(58) Field of Classification Search
CPC .......... H04B 1/26; H03D 7/161; H03D 7/163; H03D 7/165; H03D 7/166
(Continued)

(56) References Cited

U.S. PATENT DOCUMENTS

| 3,889,191 A | 6/1975 | Hershberg | 331/60 |
| 7,298,600 B2 | 11/2007 | Takikawa | 361/119 |

(Continued)

OTHER PUBLICATIONS

Hemlich, Michael., "Design an ETSI E-Band Circut", http://mwrf.com/analog-semiconductors/design-etsi-e-band-circut.htm, Oct. 7, 2013, 8 pages.

(Continued)

*Primary Examiner* — Lee Nguyen
(74) *Attorney, Agent, or Firm* — Christopher P. Maiorana, PC

(57) ABSTRACT

An apparatus includes a first receiver frequency conversion stage and a second receiver frequency conversion stage. The first receiver frequency conversion stage may be configured to generate at least four first intermediate frequency signals in response to a radio frequency (RF) input signal and respective phases of a first local oscillator signal. The second receiver frequency conversion stage may be configured to generate at least four output signals in response to the at least four first intermediate frequency signals and one or more phases of a second local oscillator signal. Each of the at least four output signals is generated in an independent channel in response to a respective one of the at least four first intermediate frequency signals and a respective one of the one or more phases of the second local oscillator signal.

20 Claims, 5 Drawing Sheets

(51) Int. Cl.
    *H04B 1/12*       (2006.01)
    *H03D 7/16*       (2006.01)
    *H04B 1/10*       (2006.01)

(52) U.S. Cl.
    CPC ....... *H04B 1/26* (2013.01); *H04B 2001/1072* (2013.01)

(58) Field of Classification Search
    USPC .............................. 455/207, 209, 314, 315
    See application file for complete search history.

(56) References Cited

U.S. PATENT DOCUMENTS

| | | |
|---|---|---|
| 9,407,205 B2 * | 8/2016 | Mahon ..................... H03D 7/16 |
| 2004/0113833 A1 | 6/2004 | Lee ................................. 342/20 |
| 2005/0170789 A1 | 8/2005 | Consolazio ..................... 455/78 |
| 2006/0094390 A1 | 5/2006 | Pan et al. ...................... 455/313 |
| 2013/0316668 A1 | 11/2013 | Davierwalla ................. 455/208 |
| 2014/0269865 A1 | 9/2014 | Aparin ........................... 375/222 |

OTHER PUBLICATIONS

Tokumitsu, Tsuneo, "Three-Dimensional MMIC and Its Evolution to WLCSP Technology", SEI Technical Review, No. 72, Apr. 2011, pp. 34-42.

Richardson, David,. "The Evolution & Economics of E-Band for Wireless Backhaul", Wireless Design and Development, http://www.wirelessdesignmag.com/articles/2014/05/evolution-economics-e-band-wireless-backhaul, May 30, 2014, 4 pages.

Newman, Eric et al., "A WiMax Double Downconversion IF Sampling Receiver Design", AN-851 Analog Devices, 2006, pp. 1-8.

\* cited by examiner

DOUBLE DOWN-CONVERSION WITH MULTIPLE INDEPENDENT INTERMEDIATE FREQUENCIES FOR E-BAND APPLICATIONS

This application relates to U.S. Ser. No. 14/580,674, filed Dec. 23, 2014, which is incorporated by reference in its entirety.

FIELD OF THE INVENTION

The present invention relates to wireless communication generally and, more particularly, to a method and/or apparatus for implementing double down-conversion with multiple independent intermediate frequencies for E-band applications.

BACKGROUND OF THE INVENTION

Increasing demand for bandwidth-intensive wireless communication of voice, video, and data is straining point to point and backhaul radio networks, and cellular base stations, particularly in densely populated metropolitan areas. To reduce this strain, mobile operators are turning to the European Telecommunications Standard Institute (ETSI) "E-band" frequency spectrum to expand wireless network capacity at fiber-caliber data rates. The E-band frequency spectrum for point-to-point (PTP) (also known as "wireless backhaul") includes two 5 GHz wide blocks: 71-76 GHz and 81-86 GHz. The ETSI E-band specification specifies a receiver (also referred to as a "down-converter") be able to handle a "strong interferer" (i.e., 30 dB above threshold) anywhere in the two 5 GHz wide blocks (except for very close to the desired signal).

The strong interferer in turn creates a linearity specification called "IF/2" when a frequency of the strong interferer is half-way between a frequency of a local oscillator signal of a down-converting mixer of the E-band receiver and the desired radio frequency (RF) signal, hence at IF/2. For heterodyne receivers designed to operate over the 5 GHz blocks, the IF/2 linearity specification implies that the Intermediate Frequency (IF) be set greater than 10 GHz (i.e., 2×5 GHz=10 GHz). Because of the finite bandwidth of receiver filters, the IF value increases in a real system to set the IF to be more than 12 GHz, with 17 GHz being a possible choice. One type of modern receiver has four IF outputs, representing 0, 90, 180, and 270 degrees, which are recombined. The four IF outputs are often called I, Q, I_bar, and Q_bar. In lower frequency systems (i.e., 18 GHz or 38 GHz ETSI point-to-point radios), the four IF outputs are at a much lower frequency (e.g., 1 to 3 GHz) and recombining the IF outputs is straightforward. In an E-band receiver with IF=17 GHz, recombining the IF outputs is difficult and costly.

It would be desirable to implement double down-conversion with multiple independent intermediate frequencies for E-band applications.

SUMMARY OF THE INVENTION

The present invention concerns an apparatus including a first receiver frequency conversion stage and a second receiver frequency conversion stage. The first receiver frequency conversion stage may be configured to generate at least four first intermediate frequency signals in response to a radio frequency (RF) input signal and respective phases of a first local oscillator signal. The second receiver frequency conversion stage may be configured to generate at least four output signals in response to the at least four first intermediate frequency signals and one or more phases of a second local oscillator signal. Each of the at least four output signals is generated in an independent channel in response to a respective one of the at least four first intermediate frequency signals and a respective one of the one or more phases of the second local oscillator signal.

The objects, features and advantages of the present invention include providing a method and/or apparatus for implementing double down-conversion with multiple independent intermediate frequencies for E-band applications that may (i) generate multiple intermediate frequency signals in a first receiver stage and down-convert each of the intermediate frequency signals in a respective independent channel of a second receiver stage, (ii) produce a number of intermediate frequency signals that may be inputted to a conventional lower frequency receiver, (iii) down-convert an E-band signal to multiple baseband signals, (iv) provide electrostatic discharge (ESD) protection for each channel of the second receiver stage, and/or (v) be implemented in a single microwave monolithic integrated circuit (MMIC).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
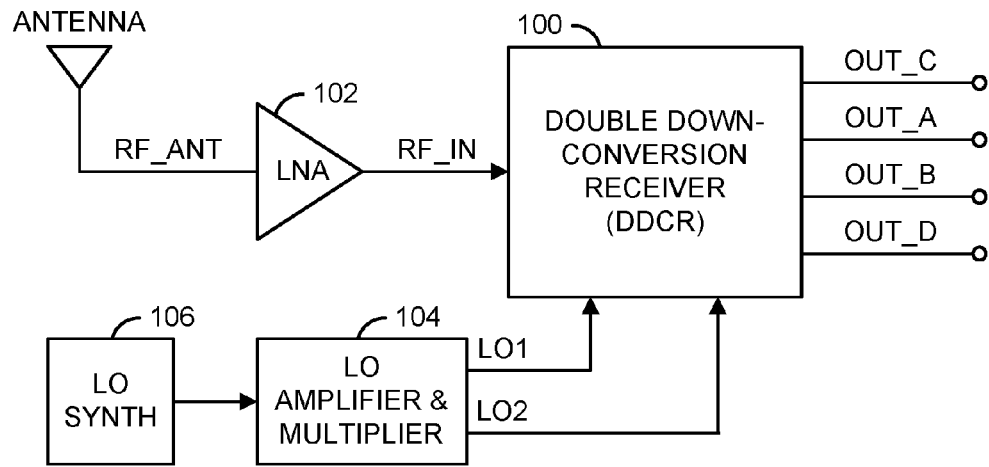
FIG. 1 is a diagram illustrating a receiver system in accordance with an example embodiment of the invention.

Referring to FIG. 1, a diagram is shown illustrating a radio receiver system including a circuit 100 in accordance with an example embodiment of the present invention. The circuit 100 generally implements a double down-conversion receiver (DDCR) in accordance with an embodiment of the present invention. The circuit 100 may be configured to generate multiple output signals (e.g., OUT_A, OUT_B, OUT_C, OUT_D) in response to a radio frequency (RF) input signal (e.g., RF_IN) and multiple local oscillator (LO) signals (e.g., LO1 and LO2). In various embodiments, the signal RF_IN comprises a RF signal in the ETSI E-band frequency spectrum and the output signals OUT_A, OUT_B, OUT_C, and OUT_D comprise intermediate frequency (IF) or baseband (BB) signals. Although the embodiment illustrated shows the circuit 100 generating four output signals, in some embodiments, the circuit 100 may be configured to generate only two output signals (e.g., OUT_A and OUT_B).

In one example, the circuit 100 may have a first input that may receive the signal RF_IN, a second input that may receive a first local oscillator signal (e.g., LO1), a third input that may receive a second local oscillator signal (e.g., LO2), and a number of outputs that may present two or four of the output signals OUT_A, OUT_B, OUT_C, and OUT_D. In one example, the signal RF_IN may be provided by a low noise amplifier (LNA) 102 from a signal (e.g., RF_ANT) received from an antenna. The LNA 102 is generally coupled to the antenna and the circuit 100 by respective filter (e.g., bandpass filters, anti-image filters, etc.) circuits (not shown).

In some embodiments, the local oscillator signals LO1 and LO2 may be provided by a local oscillator amplifier and multiplier circuit 104. In one example, a frequency of the local oscillator signal LO1 may be a multiple (e.g., ×2, ×4, ×8, ×10, etc.) of a frequency of the local oscillator signal LO2. The local oscillator amplifier and multiplier circuit 104 may be configured to generate the signals LO1 and LO2 in response to an output from a local oscillator synthesizer circuit 106. In some embodiments, the output of the local oscillator synthesizer circuit 106 may be used as the second local oscillator signal LO2. In one example, the circuit 104 and the circuit 106 may be implemented using conventional techniques.

Figure 2:
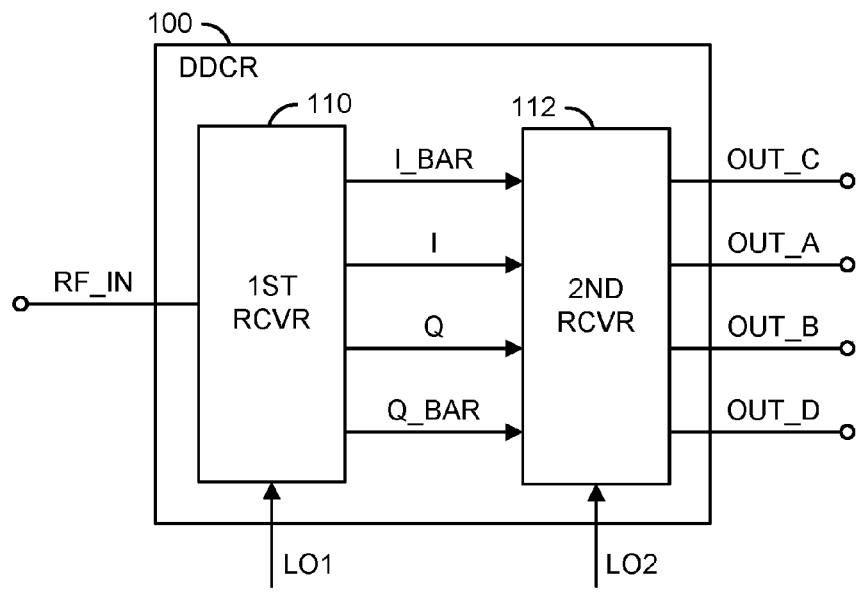
FIG. 2 is a diagram illustrating a double down-conversion receiver architecture in accordance with an embodiment of the invention.

Referring to FIG. 2, a diagram of the circuit 100 is shown further illustrating an example double down-conversion receiver architecture in accordance with an example embodiment of the invention. In one example, the circuit 100 may comprise a circuit 110 and a circuit 112. The circuit 110 may implement a first receiver stage. The circuit 112 may implement a second receiver stage. The circuit 110 may receive the signal RF_IN and the first local oscillator signal LO1 and present a number of output signals (e.g., I, I_bar, Q, and Q_bar). In embodiments where only two outputs are desired, the circuit 110 may be configured to present only the signals I and Q. The circuit 112 may have a number of inputs that may receive the signals I, I_bar, Q, and Q_bar, an input that may receive the second local oscillator signal LO2, and a number of outputs at which the output signals OUT_A, . . . , OUT_D may be presented. In embodiments where only two outputs are desired, the circuit 112 may be configured to receive the signals I and Q and present the signals OUT_A and OUT_B. The circuit 112 may be further configured to provide electrostatic discharge protection to the intermediate frequency signal lines.

Figure 3:
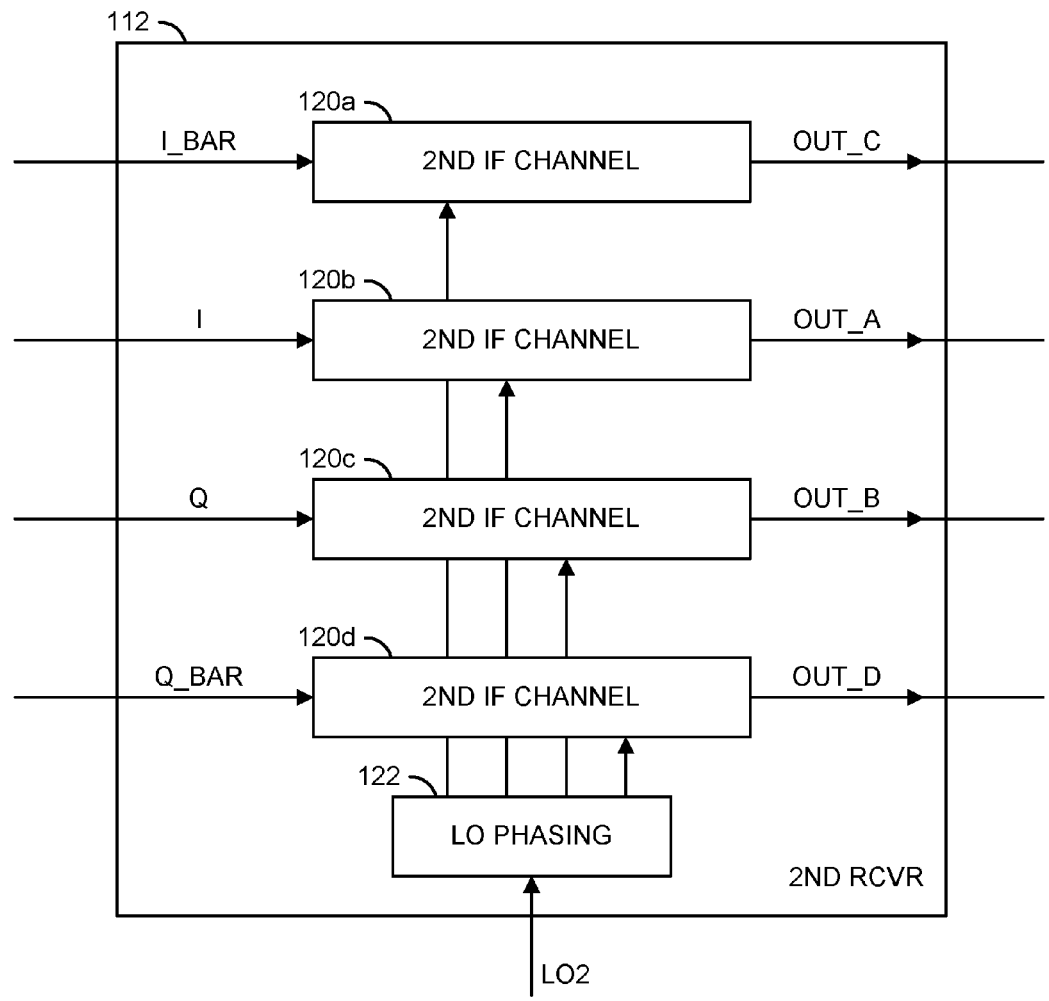
FIG. 3 is a diagram illustrating a receiver architecture of a second receiver circuit of FIG. 2.

Referring to FIG. 3, a block diagram illustrating an example architecture for the second receiver circuit 112 of FIG. 2 is shown. In various embodiments, the circuit 112 may comprise a plurality of intermediate frequency channels 120a-120d and a local oscillator phasing circuit 122. Each of the intermediate frequency channels 120a-120d may have (i) a first input receiving a respective one of the intermediate frequency signals I, I_bar, Q, and Q_bar, (ii) a second input receiving a respective phase of the second local oscillator signal LO2, and (iii) an output at which a respective one of the output signals OUT_A, OUT_B, OUT_C, and OUT_D is presented. In various embodiments, each of the intermediate frequency channels 120a-120d may include a resistive mixer configured to generate a respective one of the signals OUT_A, OUT_B, OUT_C, and OUT_D in response to respective ones of the signals I, I_bar, Q, Q_bar and respective phases of the local oscillator signal LO2. The resistive mixers may be implemented to also provide electrostatic discharge (ESD) protection to the intermediate frequency signal lines.

Figure 4:
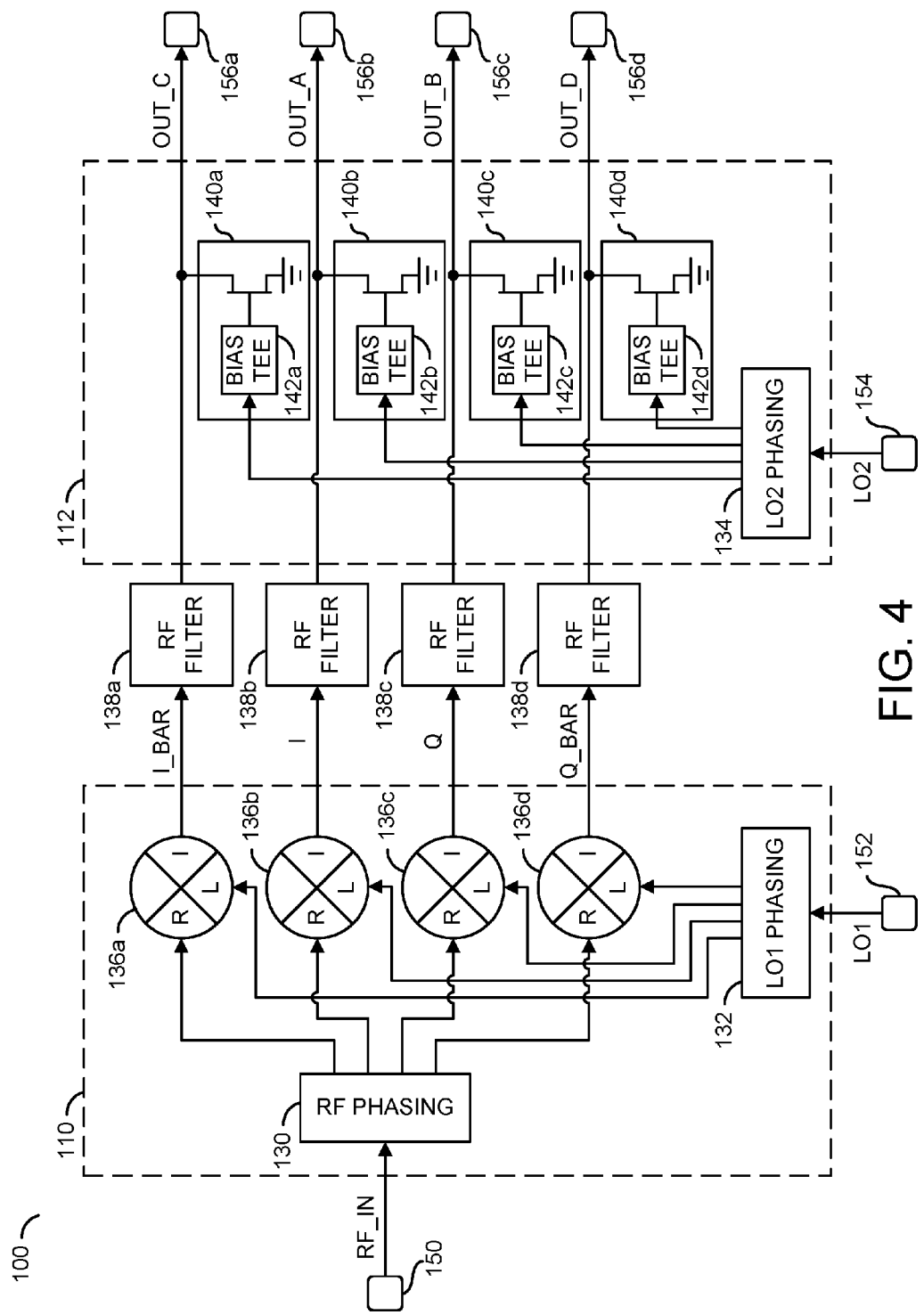
FIG. 4 is schematic diagram illustrating an example implementation of the double down-conversion receiver of FIG. 2

Referring to FIG. 4, a schematic diagram illustrating an example implementation of the circuit 100 is shown. In various embodiments, the circuit 100 may be implemented with a block (or circuit) 130, a block (or circuit) 132, a block (or circuit) 134, a number of blocks 136a-136d, a number of blocks (or circuits) 138a-138d, and a number of blocks (or circuit) 140a-140d. The block 130 may implement RF splitting and phase adjusting circuit. The block 132 may generate a number of phases (e.g., 0, 90, 180, and 270) of the first local oscillator signal LO1. The block 134 may generate a number of phases (e.g., 0, 90, 180, and 270) of the second local oscillator signal LO2. In various embodiments, the blocks 132 and 134 may be implemented by combining a number of transmission lines (e.g., stripline, microstrip, etc.) configured to provide predetermined amounts of phase shift to signals in the appropriated frequency range. In some embodiments, the blocks 132 and 134 may be implemented using phase shifting circuits including, but not limited to, a Lange Coupler, Hybrid Coupler, or Rat-Race Coupler on microstrip, or an overlay coupler in a stripline circuit.

The blocks 136a-136d may implement a number of first down-converting mixers. In various embodiments, the blocks 136a-136d may operate at a first intermediate frequency (e.g., 17 GHz). In embodiments addressing high linearity applications, the blocks 136a-136d may be implemented with resistive/cold FET type mixers.

In other embodiments, the blocks 136a-136d may be implemented as fundamental or anti-parallel diode mixers. However, other types of mixers may be implemented accordingly to meet the design criteria of a particular implementation.

The blocks 138a-138d may implement a number of RF filters. In one example, the blocks 138a-138d may be implemented as LC bandpass filters. The blocks 138a-138d are generally configured to allow transmission of the intermediate frequency (IF) while simultaneously blocking leakage of the LO and RF signals out of the IF port. The blocks 138a-138d also provide appropriate impedance loads at the RF, LO and other non-IF frequencies.

The blocks 140a-140d may implement a number of independent second down-converting mixer channels. In various embodiments, each of the blocks 140a-140d may be configured to down-convert from a first intermediate frequency (e.g., 17 GHz) to a second intermediate frequency (e.g., 1-3 GHz) or from the first intermediate frequency (e.g., 17 GHz) to base-band. In various embodiments, the blocks 140a-140d are implemented with Field Effect Transistors (FETs) configured as resistive down-converting mixers. The outputs of the blocks 140a-140d are generally connected directly to pins (or pads) of the integrated circuit. Output filters may be provided by end users to meet the particular design criteria of their particular application.

In one example, each of the blocks 140a-140d may be implemented using a High-electron-mobility transistor (HEMT), also known as heterostructure FET (HFET) or modulation-doped FET (MODFET). In one example, a pseudomorphic HEMT may be used. However, other devices may be implemented accordingly (e.g., all types of bipolar transistors (BJT, HBT, etc.), field-effect transistors (FETs) and/or diodes). The transistors may be fabricated using any available technology (e.g., compound-semiconductor, silicon, etc.). The transistors of the blocks 140a-140d are generally sized to meet design criteria such as a linearity specification of a system and to also provide ESD protection to the individual intermediate frequency signal lines. In various embodiments, a number of blocks (or circuits) 142a-142d may be included also. Each of the blocks 142a-142d may implement a bias tee for a local oscillator input port of a corresponding one of the blocks 140a-140d.

The circuit 100 may be implemented in a variety of integrated circuit configurations. In a first configuration, an integrated circuit pad 150 connects the signal RF_IN directly to an input of the block 130, an integrated circuit pad 152 connects the signal LO1 directly to an input of the block 132, an integrated circuit pad 154 connects the signal LO2 directly to an input of the block 134, and the outputs of the blocks 140a-140d are connected directly to integrated circuit pads 156a-156d, respectively. In a second configuration, a local oscillator amplifier and multiplier circuit couples one or both of the pads 152 and 154 to the blocks 132 and 134, respectively. In a third configuration, a low noise amplifier circuit couples the pad 150 to the input of the block 130 and a local oscillator amplifier and multiplier circuit couples one or both of the pads 152 and 154 to the blocks 132 and 134, respectively.

Figure 5:
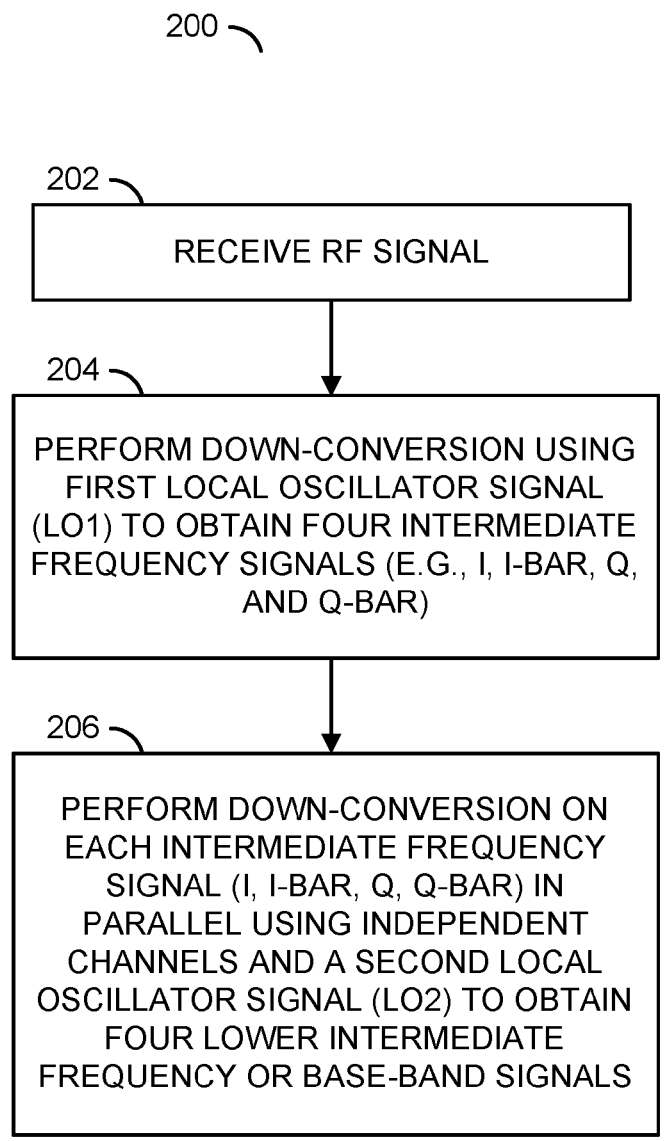
FIG. 5 is a flow diagram of a process in accordance with an embodiment of the invention.

Referring to FIG. 5, a flow diagram is shown illustrating an example down-conversion process in accordance with an example embodiment of the present invention. In one example, a process or method 200 may comprise a step 202, a step 204 and a step 206. In the step 202, the process 200 may receive an RF signal (e.g., an E-band short distance backhaul signal). In the step 204, the process 200 may perform down-conversion using a first intermediate frequency (e.g., LO1) to obtain a plurality of signals (e.g., either I and Q, or I, I_bar, Q and Q_bar). In the step 206, the process 200 may perform a second down-conversion on each signal generated in the step 204. In the step 206, each of the down-conversion signals is generated in parallel using an independent intermediate frequency channel and a respective second local oscillator signal.

Figure 6:
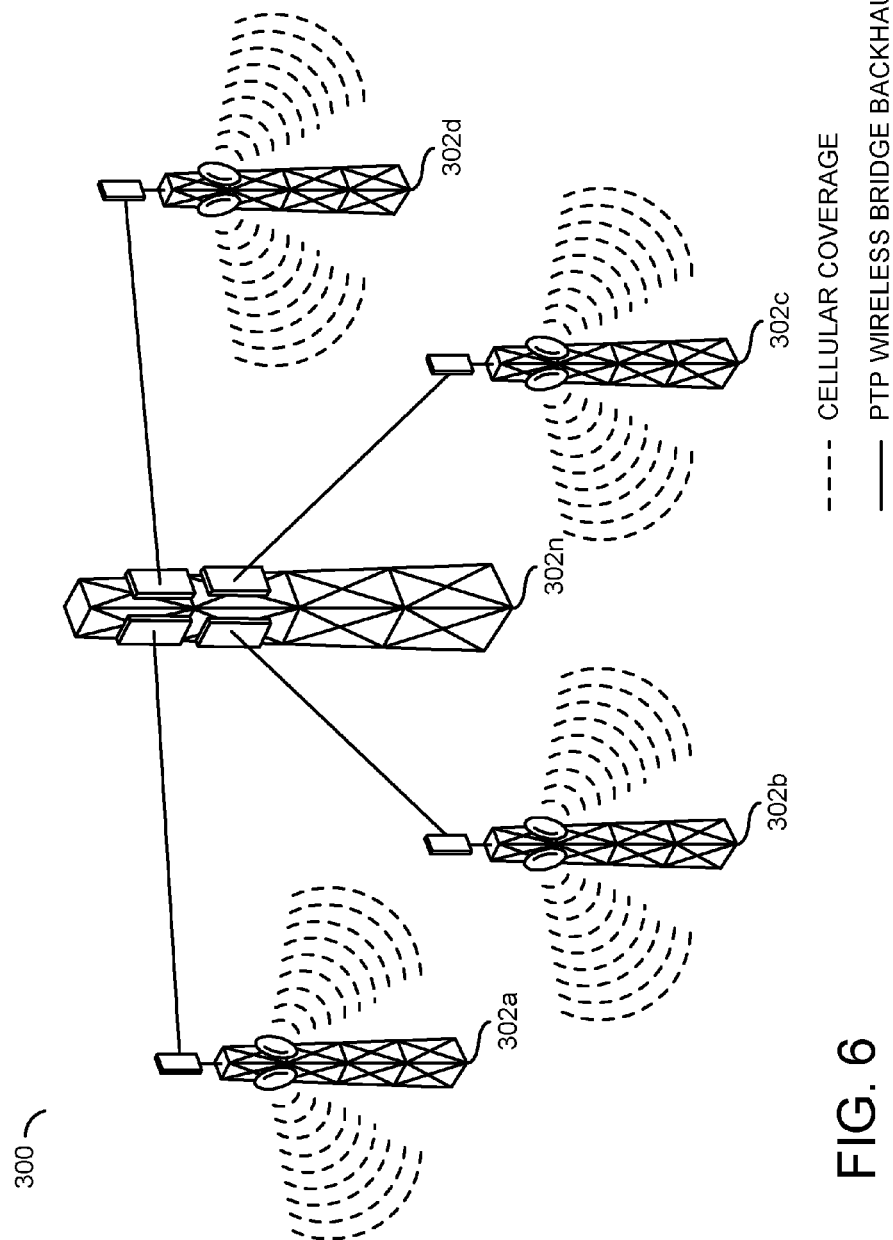
FIG. 6 is a diagram illustrating a communication system in which double down-conversion receivers in accordance with an embodiment of the invention may be utilized.

Referring to FIG. 6, a diagram is shown illustrating a communication system 300 in which double down-conversion receivers in accordance with various embodiments of the invention may be utilized. In various embodiments, a plurality of point-to-point (PTP) wireless bridge backhaul channels may be used to link a plurality of base stations 302a-302d. Each of the plurality of point-to-point (PTP) wireless bridge backhaul channels may be implemented using double down-conversion receivers in accordance with various embodiments of the invention.

In various embodiments, a new receiver architecture is provided that does not combine the multiple IF outputs (e.g., representing 0, 90, 180, and 270 degrees and often called I, Q, I_bar, and Q_bar) from a first receiver (down-converter) before passing the IF outputs to a single channel second receiver (down-converter). Instead, the new radio architecture includes a second receiver stage comprising parallel channels, each of which down-converts a respective one of the IF outputs received from the first receiver either to base-band or to a much lower IF. In some embodiments, the lower IF is the 1 to 3 GHz used in existing and commonplace ETSI point-to-point radios (e.g., at 18 GHz or 38 GHz). In some embodiments, the lower IF may be at or close to zero frequency (e.g., a direct conversion application). The second receiver (down-converter) with multiple parallel IF channels may be implemented in a variety of technologies (e.g., gallium arsenide (GaAs), silicon germanium (SiGe), etc.). The particular technology used may be chosen based on the overall linearity and noise specifications of a particular system. In one example, the receiver may be fabricated in GaAs, with the first receiver (down-converter) and the second receiver (down-converter) combined onto a single Microwave Monolithic Integrated Circuit (MMIC). In various embodiments, the second receiver (down-converter) is configured to reuse Electro-Static Discharge (ESD) protection Field Effect Transistors (FETs) protecting the IF lines to also act as the down-converting mixers of the second receiver, thereby saving considerable circuit area and reducing cost.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first receiver frequency conversion stage configured to generate at least four first intermediate frequency signals in response to a radio frequency (RF) input signal and respective phases of a first local oscillator signal; and
   a second receiver frequency conversion stage configured to generate at least four output signals in response to said at least four first intermediate frequency signals and one or more phases of a second local oscillator signal, wherein each of said at least four output signals is generated in an independent channel in response to a respective one of said at least four first intermediate frequency signals and a respective one of said one or more phases of said second local oscillator signal.

2. The apparatus according to claim 1, wherein:
   said second receiver frequency conversion stage comprises a plurality of parallel intermediate frequency (IF) channels and each of said IF channels is configured to generate one of said output signals.

3. The apparatus according to claim 1, wherein said first and second receiver frequency conversion stages are fabricated on a single integrated circuit.

4. The apparatus according to claim 3, wherein said integrated circuit is a microwave monolithic integrated circuit (MMIC).

5. The apparatus according to claim 3, wherein said integrated circuit further comprises:
   a local oscillator circuit configured to generate at least one of said first local oscillator signal and said second local oscillator signal; and
   a local oscillator phasing circuit configured to generate at least one of (i) said respective phases of said first local oscillator signal and (ii) said one or more phases of said second local oscillator signal.

6. The apparatus according to claim 3, wherein said integrated circuit further comprises a low noise amplifier (LNA) circuit coupling said RF input signal to an input of said first receiver frequency conversion stage.

7. The apparatus according to claim 1, wherein said first receiver frequency conversion stage down-converts said RF input signal to a first intermediate frequency range and said second receiver frequency conversion stage down-converts each of said first intermediate frequency signals to at least one of base-band and a second intermediate frequency range that is lower than a range of said first intermediate frequency signals.

8. The apparatus according to claim 1, wherein each of said independent channels comprises one or more devices configured as a frequency conversion mixer for each corresponding independent channel when power is applied and as electrostatic discharge protection for each intermediate frequency signal path when no power is applied.

9. The apparatus according to claim 8, wherein the one or more devices of each of said independent channels comprise at least one of a High-electron-mobility transistor (HEMT), a heterostructure FET (HFET), a modulation-doped FET (MODFET), a pseudomorphic HEMT (pHEMT), a type of bipolar transistors, a field-effect transistor (FET), and a diode.

10. The apparatus according to claim 1, further comprising:
a first local oscillator phasing circuit configured to generate said respective phases of said first local oscillator signal and a second local oscillator phasing circuit configured to generate said respective phases of said second local oscillator signal, wherein each of said first and said second local oscillator phasing circuits comprises one or more of a number of transmission lines configured to provide predetermined amounts of phase shift to signals in a predetermined frequency range, a Lange Coupler, a Hybrid Coupler, a Rat-Race Coupler, an overlay coupler in a stripline circuit, and a polyphase circuit.

11. A method of converting microwave and millimeter-wave signals comprising:
generating at least four first intermediate frequency signals in response to a radio frequency (RF) input signal and at least four phases of a first local oscillator signal using a first frequency conversion circuit; and
generating at least four output signals in response to said at least four first intermediate frequency signals and one or more phases of a second local oscillator signal using a second frequency conversion circuit, wherein each of said output signals is generated in an independent frequency conversion channel in response to a respective one of said at least four first intermediate frequency signals and a respective one of said one or more phases of said second local oscillator signal.

12. The method according to claim 11, wherein:
each of said first intermediate frequency signals is presented to an input of a respective one of a plurality of parallel intermediate frequency (IF) channels and each of said IF channels is configured to generate one of said output signals.

13. The method according to claim 11, further comprising generating said at least four phases of said first local oscillator signal and said one or more phases of said second local oscillator signal on a single integrated circuit containing said first frequency conversion circuit and said second frequency conversion circuit.

14. The method according to claim 11, further comprising generating said first local oscillator signal having a frequency that is a multiple of a frequency of said second local oscillator signal.

15. The method according to claim 11, further comprising amplifying said RF input signal using a low noise amplifier (LNA) circuit.

16. The method according to claim 11, further comprising configuring a frequency conversion mixer of each independent frequency conversion channel to provide electrostatic discharge protection to each intermediate frequency signal path of said first and second frequency conversion circuits when no power is applied and operate as said frequency conversion mixer for each corresponding IF channel when power is applied.

17. The method according to claim 11, wherein:
said RF input signal is down-converted to a first intermediate frequency range and split into component signals; and
said component signals are each down-converted to at least one of base band and a second intermediate frequency range that is lower than said first intermediate frequency range.

18. The method according to claim 11, wherein a frequency of each of said first intermediate frequency signals and a frequency of each respective second local oscillator signal are microwave frequencies.

19. The method according to claim 11, wherein a frequency of each respective first local oscillator signal is about 17 GHz and a frequency of each respective second local oscillator signal ranges from about 1 to about 3 GHz.

20. The method according to claim 11, wherein said first frequency conversion circuit and said second frequency conversion circuit are part of a receiver operable in at least one of a microwave frequency range, a millimeter-wave frequency range, and an E-band frequency range.

* * * * *